United States Patent
DeVeau et al.

[11] Patent Number: 5,994,679
[45] Date of Patent: Nov. 30, 1999

[54] THERMAL HOUSING FOR OPTICAL CIRCUITS

[75] Inventors: George Frank DeVeau, Cumming; Daren Li, Marietta, both of Ga.

[73] Assignee: Lucent Technologies Inc., Murray Hill, N.J.

[21] Appl. No.: 08/994,266

[22] Filed: Dec. 19, 1997

[51] Int. Cl.⁶ .................................................. F27D 11/02
[52] U.S. Cl. .................. 219/530; 219/531; 219/520; 219/521; 219/209; 219/210
[58] Field of Search ..................... 219/520, 521, 219/524, 530, 531, 482, 490, 494, 200, 201, 209, 210, 385, 386

[56] References Cited

U.S. PATENT DOCUMENTS

| | | | |
|---|---|---|---|
| Re. 34,179 | 2/1993 | Eccleston | 307/310 |
| 3,694,626 | 9/1972 | Harnden, Jr. | 219/541 |
| 3,883,715 | 5/1975 | Gebo | 219/210 |
| 4,251,714 | 2/1981 | Zobele | 219/275 |
| 4,307,289 | 12/1981 | Thomas et al. | 219/521 |
| 4,369,355 | 1/1983 | Helixon | 219/521 |
| 4,388,521 | 6/1983 | Thomas et al. | 219/521 |
| 4,414,576 | 11/1983 | Randmae | 358/229 |
| 4,460,820 | 7/1984 | Matsumoto et al. | 219/385 |
| 4,672,180 | 6/1987 | Kusunoki et al. | 219/494 |
| 4,684,783 | 8/1987 | Gore | 219/210 |
| 4,833,681 | 5/1989 | Akiyama et al. | 372/32 |
| 4,873,424 | 10/1989 | Ryder et al. | 219/521 |
| 4,968,121 | 11/1990 | Bruesselbach et al. | 350/354 |
| 5,136,671 | 8/1992 | Dragone | 385/46 |
| 5,235,159 | 8/1993 | Kornrumpf et al. | 219/486 |
| 5,539,618 | 7/1996 | Wiesa et al. | 361/720 |
| 5,559,915 | 9/1996 | DeVeau | 385/49 |
| 5,587,096 | 12/1996 | Huvard et al. | 219/521 |
| 5,646,826 | 7/1997 | Katchmar | 361/704 |

FOREIGN PATENT DOCUMENTS

| | | |
|---|---|---|
| 09179078 | 7/1997 | European Pat. Off. . |
| 06260722 | 9/1994 | Japan . |
| WO 94/11763 | 5/1994 | WIPO . |

OTHER PUBLICATIONS

Motorola Semiconductor Technical Data, Motorola, Inc. 1996.

*Primary Examiner*—Philip H. Leung
*Assistant Examiner*—Fadi H. Dahbour

[57] ABSTRACT

A housing for optical integrated circuits for protecting the circuit from temperature induced stresses has a base and cap and a thermal bed contained therein. The thermal bed has a region for containing the integrated circuit therein, suspended in a thermally conductive grease. At least one heater is affixed to the thermal bed for heating it, and temperature monitoring apparatus is included for supplying signals to a control apparatus for activating the heater when the temperature of the thermal bed falls outside of the operating temperature range.

17 Claims, 4 Drawing Sheets

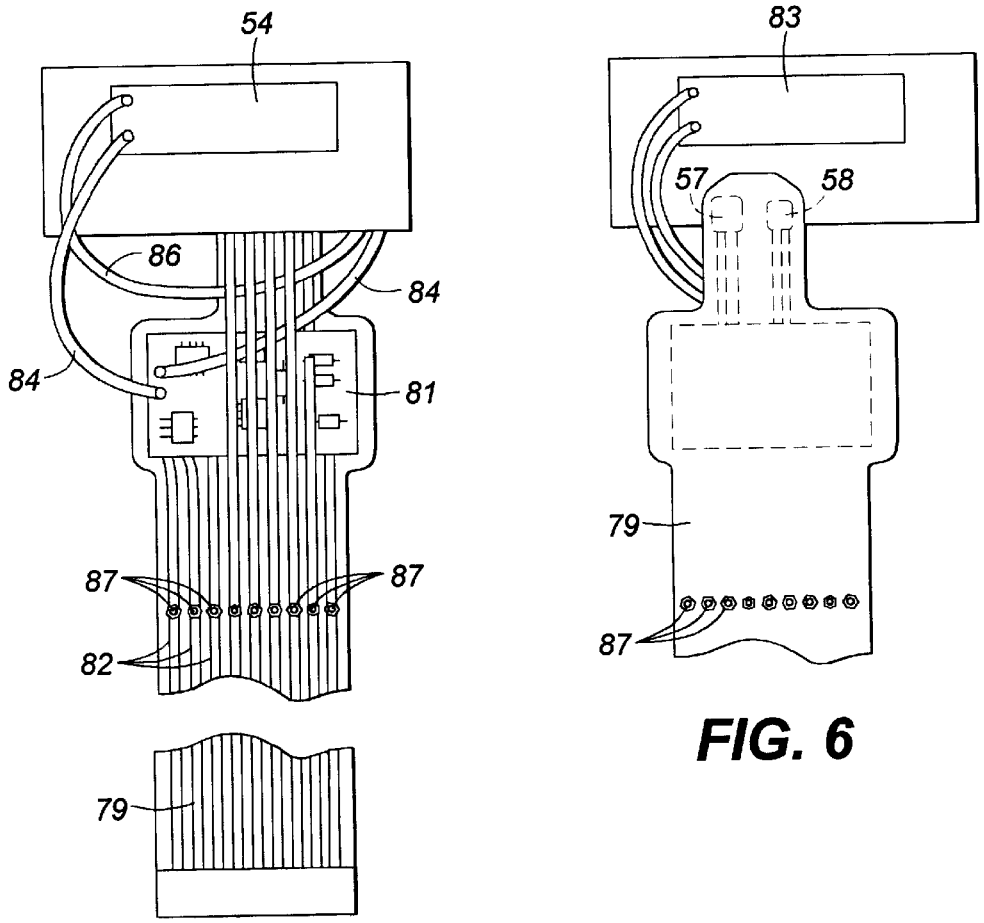
FIG. 5
FIG. 6
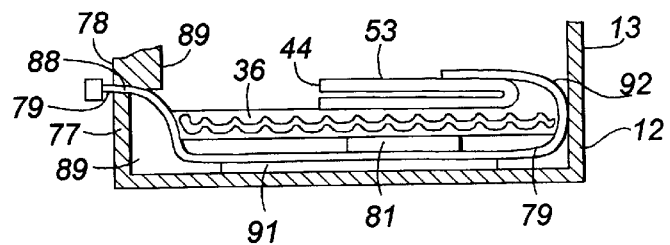
FIG. 7

THERMAL HOUSING FOR OPTICAL CIRCUITS

FIELD OF INVENTION

This invention relates to housings for optical integrated circuits and, more particularly, to a thermal housing having temperature control for maintaining an optical integrated circuit within a fixed temperature range.

BACKGROUND OF THE INVENTION

Communication systems, as well as other signal processing arrangements, are, more and more, being created utilizing optical signals requiring the use of optical fibers and the numerous components associated therewith, or are being converted to such use. The tremendous bandwidths characterizing optical signal transmission make the use of such systems the preferred mode for signal transmission. However, despite the obvious advantages from the use of optical signals, such transmission gives rise to problems that are unique to light wave signal manipulation, problems which generally are not present in lower frequency signal transmission utilizing conductive wires. For example, optical switching, multiplexing, and demultiplexing are all operations, along with others, that present problems. Such operations have, in general, required a concatenation of discrete optical components, and, as a result, suffer from increased bulkiness and reduced system reliability. As a consequence, much effort has been directed at reducing the number of components by combining their operations on a single, monolithic chip which generally comprises a thin film, compact planar optical circuit. Properly designed chips can greatly improve circuit or signal transmission performance while, at the same time, insuring greatly increased reliability and an advantageous reduction in the number of discrete components in the circuit.

One example of such a monolithic device is the dense wave division multiplexer (DWDM) of the type shown, for example, in U.S. Pat. No. 5,136,671 of Dragone, the disclosure of which is herein incorporated by reference. Such a device is useful where a large number of transmission channels must be crowded into a narrow bandwidth window. Such narrow windows can result, for example, from the use of erbium doped optical amplifiers, which are widely used today, but which can severely limit the usable bandwidth. In order to accommodate many channels in the narrow window, they must be closely spaced in wavelength, such as, for example, successive wavelengths differing by 0.8 nm or 1.6 nm. By use of a new technology referred to as OASIC (optical application specific integrated circuits), thin film planar optical circuits can be formed to produce such a DWDM as discussed, on a single wafer or chip. Such a chip generally comprises a thin silicon wafer upon which a low refractive index silica glass lower cladding is deposited. A high index core layer is then deposited, patterned, and etched to form the optical waveguides, and then an upper cladding is deposited. Wafers for a variety of functions can be produced using the OASIC technology, however, the remainder of the discussion will be directed to the DWDM in the interest of simplicity and consistency. It should be understood that these other types of integrated circuits are by no means intended to be excluded.

One of the problems arising from the use of some OASIC devices, particularly the arrayed waveguide gratings in a DWDM, is their sensitivity to temperature changes, and to physical stresses which impair their reliability. For example, in the DWDM, because the operating wavelengths of the several individual channels differ by such a small degree, any expansion or contraction or bending due to temperature fluctuations will degrade the optical performance and, in the extreme, cause circuit failure. Likewise, temperature fluctuations less than 1° C. may cause degradation or failure. It has been found that degradation or failure can generally be prevented and reliability of the circuit insured if the temperature of the device is maintained at a predetermined temperature in a range of 75° C. to 90° C. This maintenance temperature, specific to the individual circuit, must be controlled to within a few degrees Celsius even though the ambient temperature may vary from, for example, 0° C. to 70° C. Thus, some sort of protective housing must be provided for the wafer, i.e., circuit.

Maintaining various types of electronic devices at an even temperature by housing them in sealed containers is well known in the art. In U.S. Pat. No. 4,968,121 of Brusselbach et al. there is shown such a housing for a crystal which comprises an oven having walls of thermally conductive material and an inner chamber within the oven which contains the crystal and maintains it in thermal contact with the walls of the inner chamber. Means are provided for heating both the oven walls and the crystal. Such an arrangement is both complicated and bulky, and, apparently, unsuitable for maintaining an IC wafer at a constant temperature with an economy of components and structure.

In any housing for maintaining a substantially constant temperature in at least a portion thereof, each component within the housing, as well as the housing itself, is subject to deleterious temperature effects during operation. Thus, expansion or contraction of the housing itself due to temperature changes can affect at least some of the components within the housing, to the detriment of the overall operation.

SUMMARY OF THE INVENTION

The present invention is a housing and components for an optical integrated circuit, such as a DWDM, which is structured to maintain, during operation, the temperature of a circuit and surrounding elements within a narrow temperature range, regardless of ambient temperature, for extended periods, even for years.

The housing comprises a base and a snap on cover made of a glass filled polyphenylene sulfide material having a relatively low thermal coefficient of expansion. Within the housing is a layer of polyimide fibrous material which is chosen for its relative immunity to temperature changes and for its durability and insulating qualities. A pair of support members of the same material, but hardened, support a thermal bed, which comprises a substantially U-shaped aluminum member, the legs of which define a slot for receiving the circuit chip or wafer, such as the DWDM discussed hereinbefore. The slot is filled with a thermally conductive grease which suspends the wafer and allows it to float within the slot, substantially completely covered by the legs of the U-shaped bed. Thus, the wafer is in a stress free position in the slot. On the top surface of the one leg or on the surface of both legs of the U-shaped bed is a heater which, for example, may be wrapped around the bend of the U-shape, and a pair of resistive temperature devices for monitoring the temperature of the bed. Leads from the heater and the monitoring devices pass through electrical lead through pins to the exterior of the housing, and leads are extended to a control unit which measures the temperature of the thermal bed by means of signals from the resistive temperature devices, and applies a voltage to the heater when necessary. Thus, the wafer, i.e., the DWDM circuit, is contained within a uniform temperature environment and is relatively immune to mechanical stresses. For example, when the thermal bed is initially heated to the operating temperature, the wafer, because it floats within the thermal bed, is not subjected to stress. The thermal grease increases the thermal conductivity between the thermal bed and the circuit and insures that the temperature is uniform over the entire circuit and that there are no hot spots.

As will be discussed more fully hereinafter, at least some of the optical fibers are contained in ribbons, and where they join the DWDM can also be subjected to stresses. The method of assembly of the housing and components is such that this stress is substantially eliminated. After the thermal bed is placed upon the support blocks and the electrical leads connected to the feed through pins, a second layer of thermal insulation is placed within the housing to overlie the components contained therein, and the lid of the housing is snapped into place on the base.

In an alternative embodiment of the housing assembly, the temperature control circuit is contained within the housing, although power for the heater is still supplied by an external source.

The housing of the invention thus insures that the temperature of the optical circuit, e.g., the DWDM, is maintained within a narrow range which is uniform over the entire area of the circuit, thereby insuring a constant, reliable performance over a number of years, e.g., twenty years.

The numerous features and advantages of the present invention will be more readily apparent from the following detailed description, read in conjunction with the accompanying drawings.

DESCRIPTION OF THE DRAWINGS

FIG. 5 is a plan view of an alternative control member for mounting within the housing;

FIG. 6 is a plan view showing the reverse side of the control arrangement of FIG. 5; and FIG. 7 is a partial cross-section detail of the arrangement of FIG. 4 using the control member of FIG. 6.

DETAILED DESCRIPTION

Figure 1:
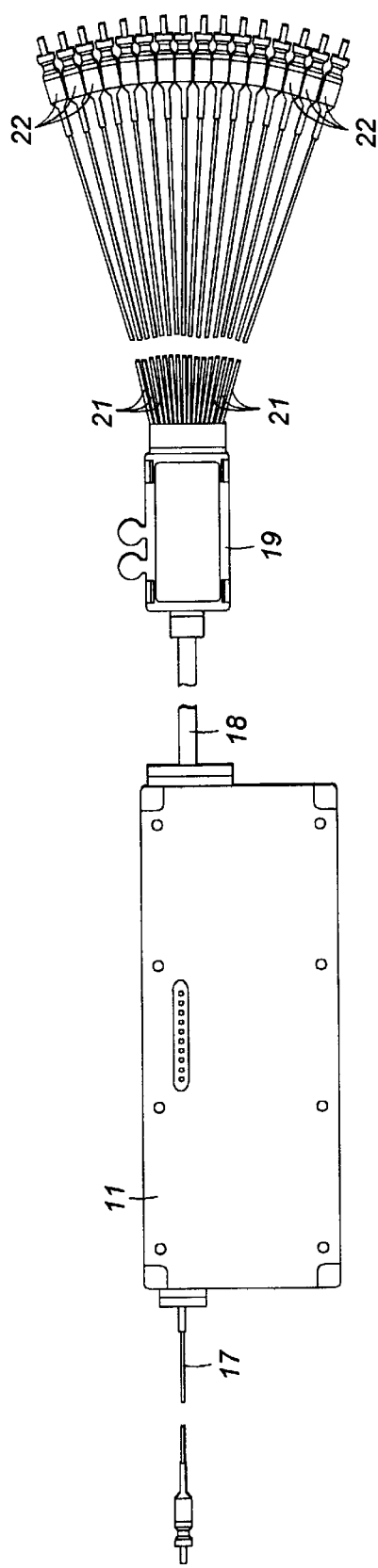
FIG. 1 is a plan view of the housing of the invention with associated circuitry.
Figure 2:
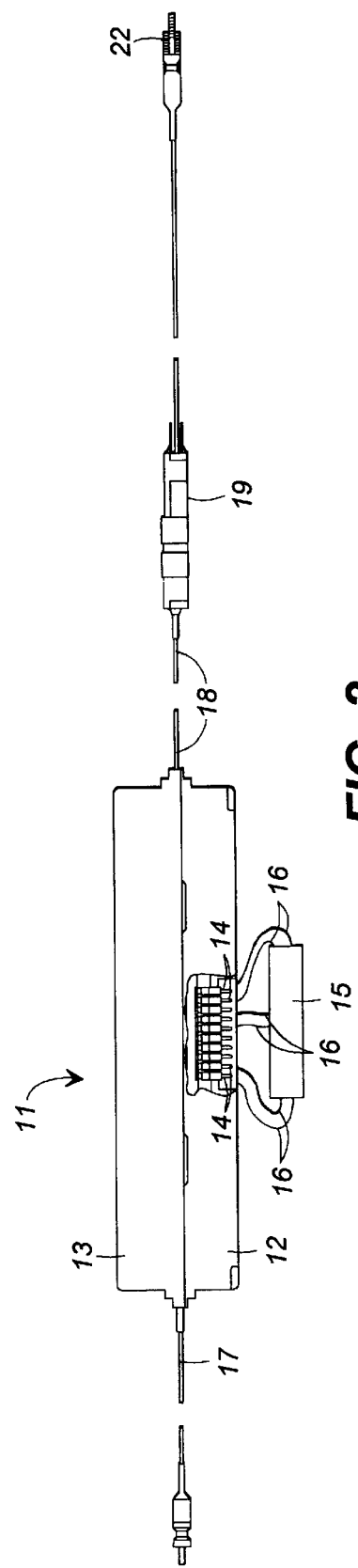
FIG. 2 is an elevation view of the arrangement of FIG. 1.

FIGS. 1 and 2 depict the housing 11 of the present invention as used to house a DWDM, not shown. Housing 11 comprises a base member 12 and a cap or lid 13. Shown in cutaway in FIG. 2 are a plurality of electrical feed through pins 14 for connecting the components within the housing to an outside temperature control circuit and power source 15 by suitable leads 16. An input buffered or insulated fiber 17 passes into the housing 11 for carrying optical signals to the DWDM within the housing. The signal output of the DWDM circuit exits housing 11 in a fiber ribbon 18, wherein each fiber in the ribbon carries signals of one specific frequency. The ribbon 18 passes into a transition piece 19 wherein each fiber in the ribbon 18 is broken out and exits piece 19 in the form of a single insulated fiber 21, each having a terminating jack plug 22 at its end. In operation, input 17 carries a combination of signals having different wavelengths, and the DWDM circuit within the housing separates the signals by wavelength and applies them to the individual output fibers in ribbon 18. Thus, each of the fibers 21 carries signals of a different wavelength from any of the other fibers. As discussed in the foregoing, these wavelengths are quite closely spaced. For example, in an eight channel arrangement, the wavelengths may be 1549.4 nm, 1551.0 nm, 1552.6 nm, 1554.2 nm, 1555.9 nm, 1557.5 nm, 1559.1 nm, and 1560.7 nm. It can be seen that the successive wavelengths increase by only 1.6 nm approximately, a very small incremented difference. Spacings in 32 and 64 channel DWDMs are as small as 0.4 nm.

The arrangement shown in FIGS. 1 and 2 is reversible, i.e., individual fibers 21 may each contain signals each at one of the wavelengths, and the several signals are input to transition piece 19 where the individual fibers are combined in ribbon 18 and their signals are input to the DWDM in housing 11. The DWDM combines the several signals and outputs them on fiber 17.

Figure 3:
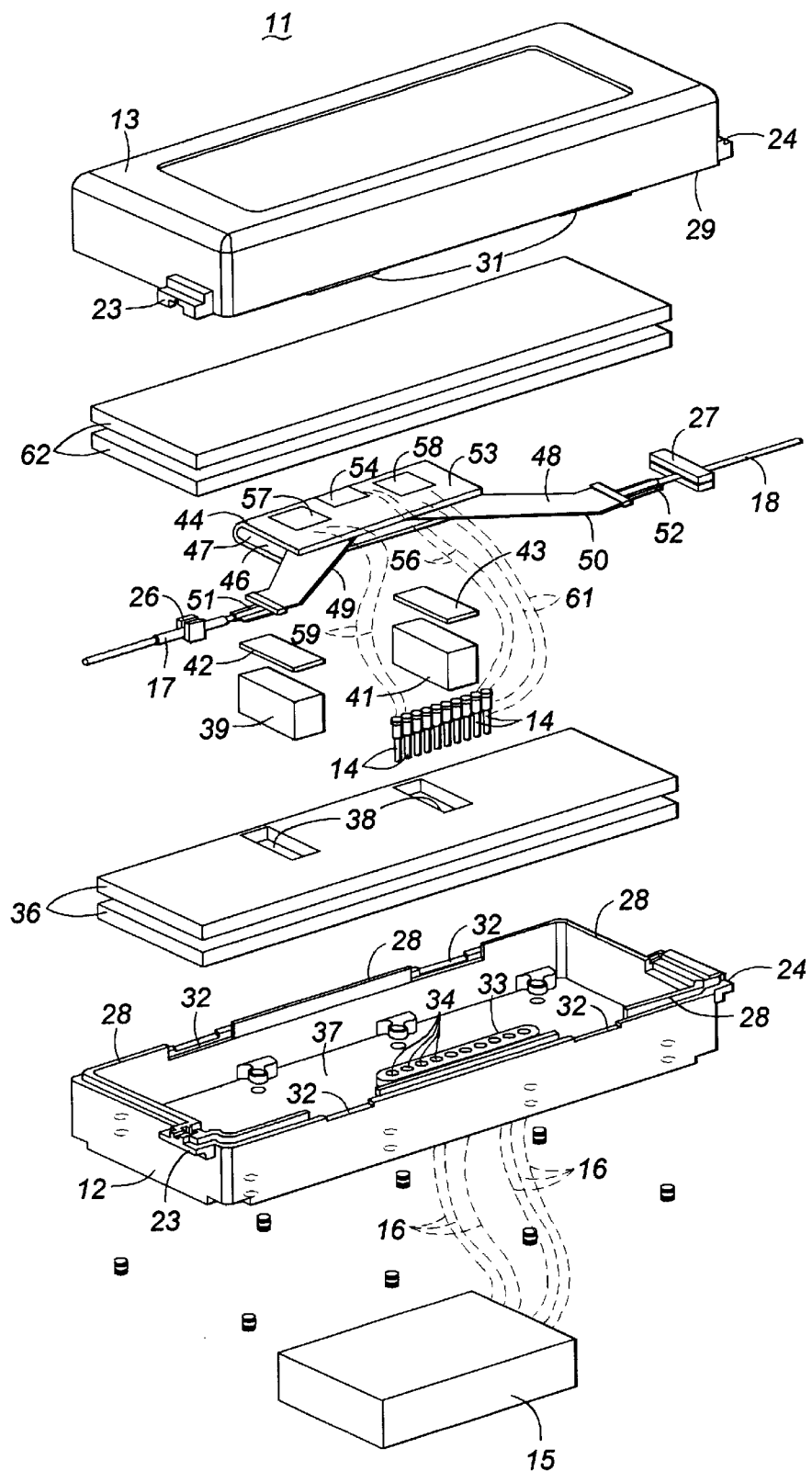
FIG. 3 is an exploded perspective view of the housing of the present invention and the components contained therein.

FIG. 3 is an exploded perspective view of the housing 11 and the components contained therein. In FIG. 3, the parts discussed in connection with FIGS. 1 and 2 bear the same reference numerals as in FIGS. 1 and 2 to maintain consistency and avoid confusion.

Base 12 and cap 13 have at each end channeled aperture members 23 and 24 which are configured to receive, in aperture 23, a fiber collar 26, preferably of thermoplastic rubber, and in aperture 24, a ribbon collar 27, also preferably of thermoplastic rubber. In assembly, collars 26 and 27 are affixed to fiber 17 and ribbon 18, respectively, and wedged into the channels of aperture 23 and 24 respectively when lid 13 and base 12 are snapped together. These collars 26 and 27 are useful in preventing undue stress on the interior components of the housing, as will be discussed more fully hereinafter. Base member 12 has a projecting rib 28 extending around the periphery thereof which mates with the lower edge 29 of cap member 13. In addition, cap member 13 has projecting members 31 which fit within slots 32 in base 12. This arrangement of ribs, projections, and slots allows cap member 13 to be snapped onto base 12 at assembly, where it is held firmly in place. Base member 12 also has, within its interior, a pedestal member 33, having apertures 34 therein for receiving and holding the several pin members 14, which project through base member 12 to the exterior, as seen in FIGS. 1 and 2.

One or two layers 36 of thermal insulation, such as polyimide fibrous material are carried with base member 12, resting on the floor 37 thereof. The thermal insulation layer 36 has first and second cutouts 38 for receiving first and second support members 39 and 41 which may be a hardened polyimide. On top of each support member 39 and 41 is a double-sided tape member 42 and 43 which is used to hold in place a thermal bed 44. Thermal bed 44 comprises a U-shaped member of suitable thermally conductive material such as aluminum defining a slot 46 which contains a thermally conductive grease 47. Grease 47 may be a highly thermally conductive, silver filled silicone grease. It should maintain its properties over broad environmental and temperature ranges, should be resistant to moisture, humidity, ozone, radiation and many chemicals. Such a material is commercially available as Norsil 56840-EC, produced by Norlabs Co.

Carried within the slot 46 is, for example, an OASIC circuit die 48 for a DWDM, as discussed hereinbefore. While thermal bed 44 is shown as U-shaped, it is possible that other shapes or configurations might be used, so long as it is capable of substantially covering circuit 48, and is capable of retaining the grease within the slot. One leg 49 of circuit 48 is connected to fiber 17 by means of a connector 51 and the other leg 50 is connected to ribbon 18 by means of a connector 52. Connectors 51 and 52 are preferably of the type shown and described in U.S. Pat. No. 5,559,915 of Deveau, and the connections made using the techniques shown and described in that patent. On the top surface 53 of thermal bed 44 and affixed thereto is a heater element 54, preferably of the resistive type, which is connected to pins 14 by leads 56, shown in dashed lines. Heater element 54 may also be wrapped around and contacting the bottom surface. Also affixed to surface 53 are first and second resistance temperature devices 57 and 58, also connected to the pins 14 by leads 59 and 61, shown in dashed lines. Overlying the thermal bed 44 and the associated components is a thermal insulating blanket 62, which fits into the interior of cap or lid 13.

When the housing 11 and the various components are assembled, pins 14 are inserted into holes 34 and the various leads 56, 59, and 61 are connected thereto, thereby connecting those leads to the various leads 16 and the control device 15. Although the housing 11, i.e., base 12 and lid 13 are made of a material having a low thermal coefficient of expansion (TCE), such as glass filled polyphenylene sulfide (PPS), the TCE is still greater than that of the silicon substrate of the wafer 48, and such differential can lead to stress, especially on the waveguide (DWDM) to fiber joints. In order that such stress be minimized, the housing is heated during assembly to, for example, at least 85° C., and the ribbon and fiber collars 26 and 27, which are expoxied to the fiber 17 and ribbon 18 respectively, wedged is place in their respective channeled apertures 23 and 24. After the epoxy cures, the package device is cooled to ambient temperature. Inasmuch as the PPS material shrinks only slightly on cooling, the fiber-waveguide joints remain under compression and thus the stress thereon is minimized for any temperatures below 85° C., which includes the operating temperature range of 75° C. to 90° C. Also, in preparation for operation, the heating element 54 heats the thermal bed 44 up to the operating range of 75° C. to 90° F., or, more particularly to a predetermined temperature dependent on the particular circuit, within the operating range. Inasmuch as the DWDM wafer 48 floats in the thermal conducting grease 47 within the slot 46, it is not subject to stresses due to the expansion of thermal bed 44. Furthermore, since as collars 26 and 27 are locked in place in their apertures 23 and 24, external stresses on fiber 17 and ribbon 18 are not communicated to the interior of the housing.

In operation, the resistance temperature devices 57 and 58, which have been previously calibrated, indicate to the control unit 15 any temperature variation of the thermal bed 44, and heating element 54 is activated to apply heat thereto, thus maintaining the desired operating range of 75° C. to 90° C. The entire housing 11 thus provides a virtually stress free environment for the DWDM or other OASIC type wafer contained therein.

The embodiment of the invention shown in FIGS. 1 through 3 includes a control circuit 15 external of the housing 11 and connected to the interior components thereof through leads 16 and pins 14. In FIGS. 4 through 7 there is shown an alternative embodiment of the invention in which the control circuit is contained within the housing 11. For simplicity, parts corresponding to like parts in FIGS. 1 through 3 bear the same reference numerals.

Figure 4:
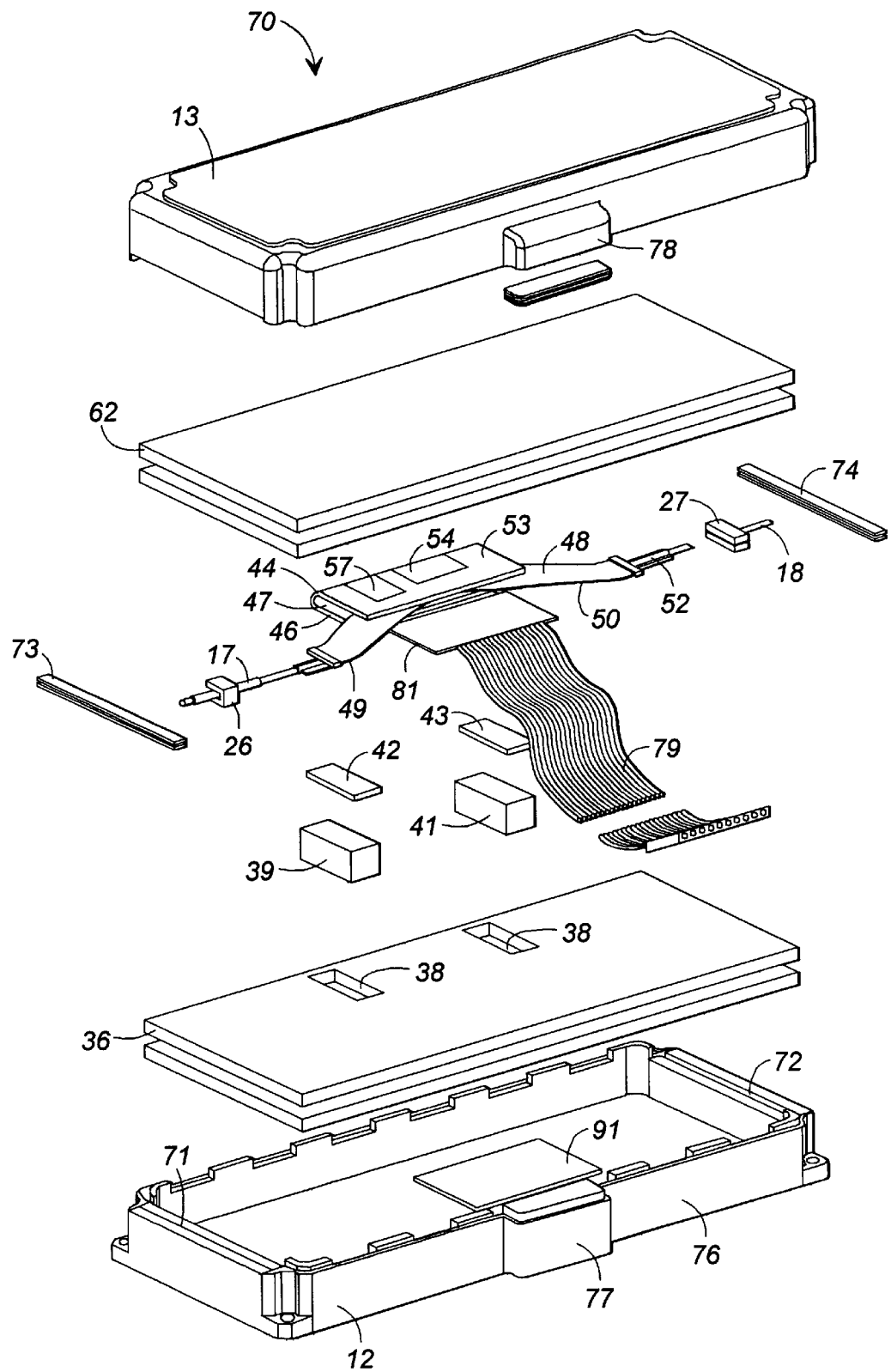
FIG. 4 is an exploded perspective view of the housing in a second embodiment of the invention.

As shown in FIG. 4, base member 12 is slightly modified from base member 12 of FIG. 3. Thus, the end edges 71 and 72 of base 12 are channeled to receive stress relieving members 73 and 74 through which the fiber 17 and ribbon 18 respectively pair. Members 73 and 74 may be made of thermoplastic rubber, for example. In addition, base member 12 has, centrally located along one side 76, a porch member 77 adapted to mate with a similar porch member 78 on cap or lid 13. As will be apparent hereinafter, when the cap 13 is snapped on to base 12, porches 77 and 78 form a slot through which a ribbon conductor 79 may pass to the exterior.

Ribbon conductor 79, as is apparent with reference to FIGS. 5 and 6 has a control circuit 91 formed thereon for responding to signals from the resistive temperature device 57 to activate heater 54. As can be seen in FIGS. 5 and 6, ribbon conductor 79, which is formed from a flexible insulating material which contains a plurality of individual conductors 82, connects control circuit 81 to resistive temperature devices 57 and 58. In addition, control circuit 81 is connected to heater 54 and to a second heater 83 by means of conductive leads 84, and 86 in a manner such that heaters 54 and 83 are connected in series. Ribbon conductor 79 has a plurality of solder connection points 87 for connecting the conductors 82 to the pins 14 shown in FIG. 3, if desired, in which case the ribbon 79 may be cut just below the solder points 87. On the other hand, the pins 14 may be eliminated and the ribbon 79 fed through the slot 88. Slot porches 77 and 78 may both contain a thermal insulating member 89 for holding the ribbon 79 in place within slot 88, and for thermally insulating the interior of housing 70.

FIG. 7 is a cross-sectional view of the housing 70 showing the manner by which thermal bed 44 and control circuit 81 are placed within housing 70. On the floor of base member 12 is a double-sided tape 91, for example, although other securing means might be used, over which ribbon 79 passes and is held in place. Ribbon 79 is looped upward at 92 so that the thermal bed 44 overlies the control circuit 81 and is separated therefrom by insulating member 36, or by other suitable insulating means. The insulation 36 protects the control circuit from the heat of thermal bed 44 and electrically from the metal thereof.

It can readily be seen that the embodiment of FIGS. 4 through 7 is basically similar to that of FIG. 3 with only slight modifications thereto to permit placing the control circuit 81 within the housing 70. The electrical connections to the exterior are for a power supply and for affording testing and calibrating operations to be performed. The actual temperature control, however, is within the housing 70.

The housing of the invention constitutes a means of protecting various types of printed circuits and the like from the deleterious consequences of temperature changes, by insuring a stable temperature environment for such circuits. Various modifications or adaptations of the principles of the invention to specific specialized uses may be made which, while perhaps involving different physical configurations, do not depart from those principles as disclosed in the foregoing.

In concluding the detailed description, it should be noted that it will be obvious to those skilled in the art that many variations and modifications may be made to the preferred embodiment without substantially departing from the principles of the present invention. All such variations and modifications are intended to be included herein as within the scope of the present invention as set forth in the claims. Further, in the claims hereafter, the corresponding structures, materials, acts, and equivalents of all means or step plus function elements are intended to include any structure, material, or acts for performing the functions with other elements as specifically claimed.

I claim:

1. A housing for an optical component comprising:
   a base member;
   a first layer of thermal insulating material within said housing;
   a thermal bed member supported within said base member on said layer, said thermal bed member having first and second legs spaced from each other defining a slit which holds an optical integrated circuit within said housing;
   a thermally conductive material within said slit which holds the optical component in substantially stress free suspension within said slit substantially covered by said legs;
   a heater member for heating said thermal bed mounted on at least one of said legs;
   a second layer of thermal insulating material overlying said thermal bed; and
   a cap member for combining with said base member to produce a closed housing for enclosing the optical component within said housing.

2. A housing as claimed in claim 1 wherein said heater means is mounted on both of said first and second legs.

3. A housing as claimed in claim 1 wherein said thermal bed comprises a substantially U-shaped thermally conductive.

4. A housing as claimed in claim 3 wherein said U-shape member is aluminum.

5. A housing as claimed in claim claim 1 wherein said thermally conductive material comprises a silvered silicone grease.

6. A housing as claimed in claim 1 and further comprising a temperature monitoring device on one of said legs.

7. A housing as claimed in claim 6 and further comprising a control circuit for receiving temperature indications from said temperature monitoring device, and activating said heater means to achieve a specified temperature within the range of 75° C. to 90° C.

8. A housing as claimed in claim 7 wherein said control circuit is external of the housing and electrically connected to said monitoring device and said heater means.

9. A housing as claimed in claim 7 wherein said control circuit is contained within said housing and is electrically connected to said monitoring device and said heater means.

10. A thermal housing for an optical component for maintaining the component at a temperature within a predetermined temperature range substantially independent of ambient temperature, said housing comprising:
    a base member;
    a thermal bed member;
    means for thermally insulating said thermal bed member from said base member and for supporting said thermal bed member therein;
    said thermal bed member having first and second legs spaced from each other defining a slit which holds and substantially covers an optical component;
    thermally conductive means within said slit which holds an optical component in suspension within said slit;
    heater means for heating said thermal bed member in contact with said thermal bed member;
    temperature sensitive means for monitoring the temperature of said thermal bed and generating electrical signals indicative thereof;
    a control circuit for receiving signals from said temperature sensitive means and actuating said heater means to maintain the temperature of said thermal bed within said predetermined temperature range; and
    a cap member adapted to mate with said base member for enclosing the optical component within said thermal housing.

11. A thermal housing as claimed in claim 10 wherein said temperature range is 75° C. to 90° C.

12. A thermal housing as claimed in claim 10 wherein the optical component has first and second optical fiber members connected thereto and said housing has channeled apertures through which the optical fiber members pass.

13. A thermal housing as claimed in claim 10 wherein said base member has a plurality of feed through pins for electrically connecting the interior of said housing to the exterior thereof.

14. A thermal housing as claimed in claim 13 wherein said control circuit is exterior of said housing and is connected to said temperature sensitive means and said heater means by means of said feed through pins.

15. A thermal housing as claimed in claim 10 wherein said control circuit is contained within said housing.

16. A thermal housing for an optical component for maintaining the component at a temperature within a predetermined temperature range, said housing comprising:
    a base member;
    a thermal bed member;
    means for thermally insulating said thermal bed from said base member and for supporting a thermal bed member therein;
    said thermal bed member having first and second legs spaced from each other defining a slit for holding an optical component;
    thermally conductive means within said slit for holding the optical component within said slit;
    heater means for heating said thermal bed in contact with said thermal bed member;
    temperature sensitive means for monitoring the temperature of said thermal bed member and generating electrical signals indicative thereof;
    a control circuit for receiving signals from said temperature sensitive means and actuating said heater means to maintain the temperature of said thermal bed member within said predetermined temperature range;
    said control circuit being formed on a ribbon conductor and connected to said heater means and said temperature sensitive means thereby, and
    a cap member adapted to mate within said base member.

17. A thermal housing as claimed in claim 16 wherein said ribbon conductor extends from said control circuit through a slit in said housing to the exterior thereof.

* * * * *